(12) United States Patent
Empedocles

(10) Patent No.: US 7,515,333 B1
(45) Date of Patent: Apr. 7, 2009

(54) NANOTECHNOLOGY-ENABLED OPTOELECTRONICS

(75) Inventor: Stephen Empedocles, Mountain View, CA (US)

(73) Assignee: Nanosy's, Inc., Palo Alto, CA (US)

( * ) Notice: Subject to any disclaimer, the term of this patent is extended or adjusted under 35 U.S.C. 154(b) by 870 days.

(21) Appl. No.: 10/460,746

(22) Filed: Jun. 12, 2003

Related U.S. Application Data

(60) Provisional application No. 60/389,029, filed on Jun. 13, 2002.

(51) Int. Cl.
*H01S 5/00* (2006.01)
*H01S 4/00* (2006.01)

(52) U.S. Cl. .................. 359/344; 977/813; 977/815; 977/818; 977/819; 977/824; 977/834; 977/932

(58) Field of Classification Search .................. 359/344; 977/813, 815, 818, 819, 824, 825, 834, 932
See application file for complete search history.

(56) References Cited

U.S. PATENT DOCUMENTS

| | | | |
|---|---|---|---|
| 5,260,957 A | | 11/1993 | Hakimi et al. |
| 5,434,878 A | * | 7/1995 | Lawandy ..................... 372/43 |
| 5,505,928 A | | 4/1996 | Alivisatos et al. |
| 5,537,000 A | | 7/1996 | Alivisatos et al. |
| 5,585,640 A | * | 12/1996 | Huston et al. ............. 250/483.1 |
| 5,717,517 A | * | 2/1998 | Alfano et al. ................ 359/342 |
| 5,751,018 A | | 5/1998 | Alivisatos et al. |
| 5,881,200 A | * | 3/1999 | Burt .......................... 385/142 |
| 6,225,198 B1 | | 5/2001 | Alivisatos et al. |
| 6,306,736 B1 | * | 10/2001 | Alivisatos et al. ........... 438/497 |
| 6,322,901 B1 | | 11/2001 | Bawendi et al. |
| 6,501,091 B1 | | 12/2002 | Bawendi et al. |
| 6,816,525 B2 | * | 11/2004 | Stintz et al. ................... 372/45 |
| 6,819,845 B2 | * | 11/2004 | Lee et al. ..................... 385/122 |
| 7,125,605 B2 | * | 10/2006 | Bawendi et al. ............. 428/403 |
| 2001/0046244 A1 | | 11/2001 | Klimov et al. |
| 2002/0114367 A1 | * | 8/2002 | Stintz et al. .................... 372/45 |
| 2003/0010987 A1 | * | 1/2003 | Banin et al. .................... 257/82 |
| 2003/0142944 A1 | | 7/2003 | Sundar et al. |
| 2003/0145779 A1 | | 8/2003 | Alivisatos et al. |

(Continued)

FOREIGN PATENT DOCUMENTS

WO    WO96/10282    * 11/2001

(Continued)

OTHER PUBLICATIONS

Karabutov, A. V., et al. "Improvement of diamond nanocomposite filed emitters by oxidation", Tech. Digest of the 17th Int'l. Vacuum Nanoelectronics Conf., (2004).*

(Continued)

*Primary Examiner*—Eric Bolda
(74) *Attorney, Agent, or Firm*—Andrew L. Filler; Matthew B. Murphy

(57) ABSTRACT

Nanomaterials for use in optoelectronic applications, and particularly nanocomposite optical amplifiers. nanocomposite optical amplifiers (NOAs), e.g., provided on integrated optical chips, for cost-effective broadband amplification across the entire clear-window of optical fiber. It is expected that such systems could provide a 15× increase in bandwidth over existing technology, while remaining compatible with all future advances in bit-rate and channel spacing.

7 Claims, 5 Drawing Sheets

U.S. PATENT DOCUMENTS

2003/0226498 A1 12/2003 Alivisatos et al.
2004/0033359 A1 2/2004 Bawendi et al.

FOREIGN PATENT DOCUMENTS

WO WO200225745 A * 3/2002

OTHER PUBLICATIONS

V. I. Klimov et al. "Quantization of Multiparticle Auger Rates in Semiconductor Quantum Dots", Science, vol. 287, pp. 1011-1013, (2000).*

X. Peng et al. "Shape control of CdSe nanocrystals", Nature, vol. 404, pp. 59-61, (2000).*

Dabbousi, B.O. et al., "(CdSe)ZnS Core-Shell Quantum Dots: Synthesis and Characterization of a Size Series of Highly Luminescent Nanocrystallites," J. Phys. Chem. B (1997) 101:9463-9475.

Efros, A.L. et al., "Breating the Phonon Bottleneck in Nanometer Quantum Dots: Role of Auger-Like Processes," Solid State Commun. (1995) 93(4):281-284.

Efros, A.L. et al., "Random Telegraph Sginal in the Photoluminescence Intensity of a Single Quantum Dot," Phys. Rev. Letts. (1997) 78(6):1110-1113.

Empedocles, S.A. et al., "Photoluminescence Spectroscopy of Single CdSe Nanocrystallite Quantum Dots," Phys. Rev. Letts. (1996) 77(18):3873-3876.

Klimov, V.I. et al., "Optical Gain and Stimulated Emisson in Nanocrystal Quantum Dots," Science (2000) 290:314-317.

* cited by examiner

NANOTECHNOLOGY-ENABLED OPTOELECTRONICS

CROSS-REFERENCE TO RELATED APPLICATIONS

This application claims priority to Provisional U.S. Patent Application No. 60/389,029, filed Jun. 13, 2002, the full disclosure of which is hereby incorporated herein by reference in its entirety for all purposes.

BACKGROUND OF THE INVENTION

The telecommunications industry has a defined set of performance and cost requirements, and an exponentially increasing demand for bandwidth. Even in today's market downturn, telecom network traffic still doubles approximately every year. Applications such as video on demand, telemedicine, interactive games and teleconferencing will increase the demands on the network infrastructure dramatically, outpacing the traditional technology. As an example, industry estimates suggest that there are about 100 million video rental transactions per week in the USA. Downloading this volume of information from the Internet would require a capacity of 40 terabits per second! In 2001, the Internet was believed to have a total capacity of about 15 terabits per second. Thus, the migration of just this single industry onto the internet would completely overload the existing infrastructure.

Given the global migration of industry to internet based business, there is an increasing and near critical need to address the mounting problem of bandwidth need. Even with the current "fiber glut", many US market links are nearing capacity. As such, there is an unavoidable need to continue increasing available bandwidth within each fiber to meet capacity needs. This is especially true as we begin to move fiber into the home, eliminating local networks as the bandwidth-bottleneck in the telecommunications system. Traditionally, fiber bandwidth has been extended by either increasing channel bit-rates or tightening channel spacing. Both of these methods have problems, however, that will ultimately limit the maximum available bandwidth.

In principle, the one "limitless" source of bandwidth is achieved by expanding the wavelength range over which data can be transmitted. There are, of course, current practical limits to the available wavelength range defined by the transmission and dispersion of today's optical fibers; however, even these can efficiently transmit from 1200 nm to 1700 nm. To date, however, the available wavelength range for telecommunications has been limited to a narrow spectral band around 1550 nm due to the narrow gain spectrum of erbium doped fiber amplifier (EDFA) (efficient gain from 1535 nm to 1570 nm). Expanding beyond this range requires the introduction of new cost-effective amplification platforms that have so far eluded the industry.

The present invention proposes to meet the needs set forth above by using nanocomposite optical amplifiers (NOAs), e.g., provided on integrated optical chips, for cost-effective broadband amplification across the entire clear-window of optical fiber. It is expected that such systems could provide a 15× increase in bandwidth over existing technology, while remaining compatible with all future advances in bit-rate and channel spacing.

This technology will allow for low-cost, highly integrated active optical circuits using high-volume manufacturing techniques such as inkjet printing or screen printing. The ability to precisely engineer the properties of NOAs will allow deployment of integrated systems that initially mimic the functionality of traditional devices, providing seamless integration into today's network infrastructure and nearly limitless expandability in the future when it is truly needed (i.e., in 5–10 years).

BRIEF SUMMARY OF THE INVENTION

The present invention is generally directed to the use of nanoscale materials, such as nanodots, nanorods and branched nanostructures in optoelectronic applications. Such materials have broad based applications in telecommunications, energy devices, analytical instrumentation, and electronics.

DETAILED DESCRIPTION

Figure 1:
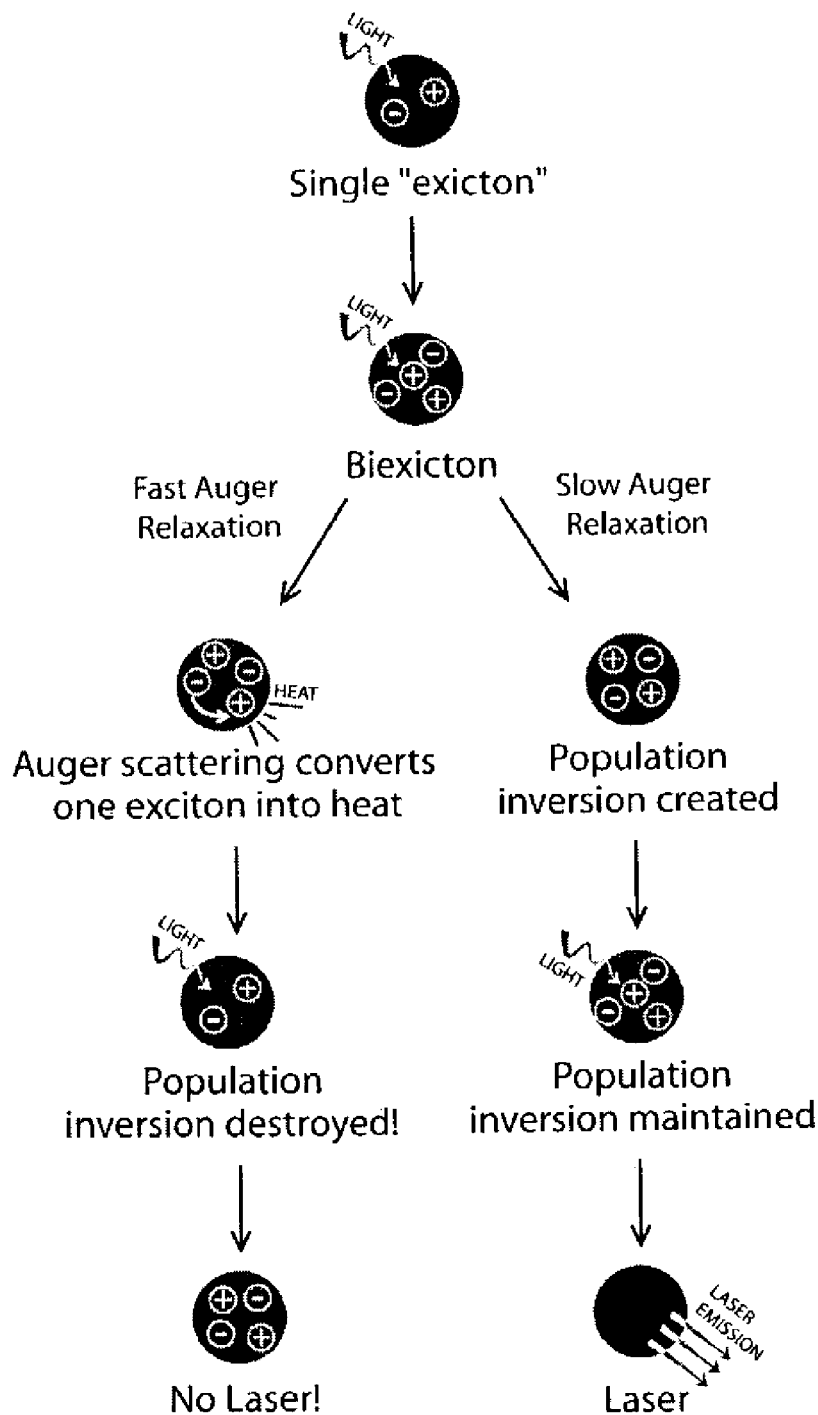
FIG. 1 schematically illustrates the effect of auger scattering on nanocrystal lasing.
Figure 2:
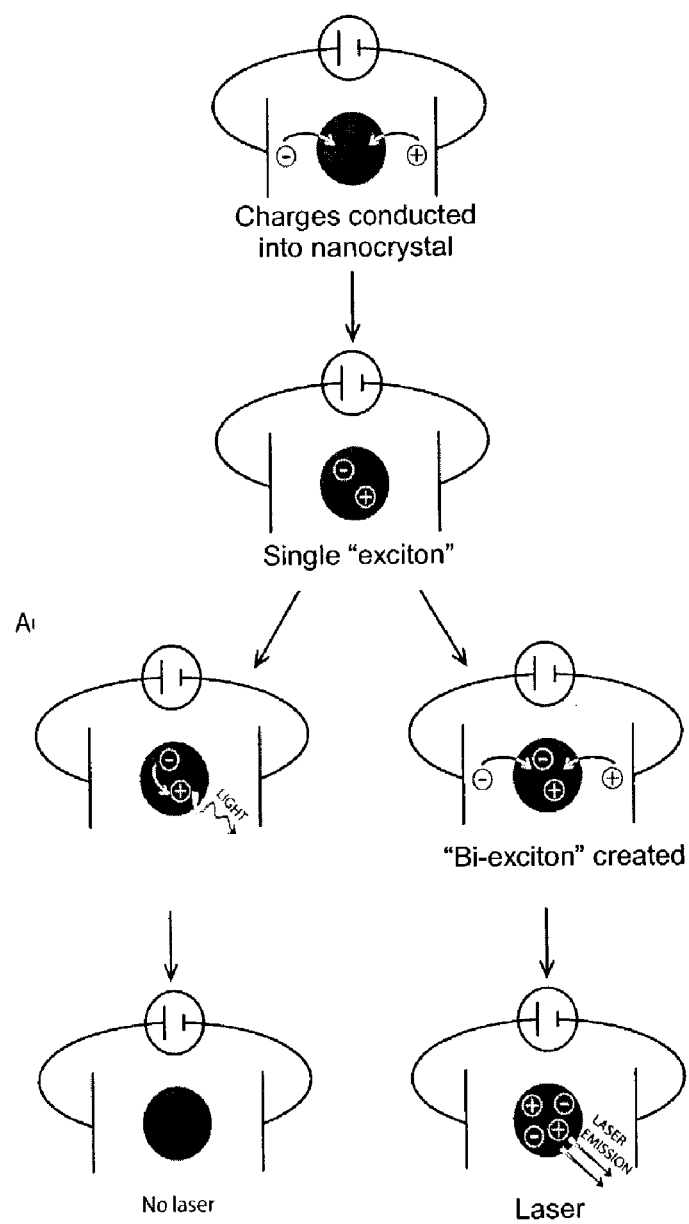
FIG. 2 schematically illustrates the effect of charge injection efficiency on nanocrystal lasing.
Figure 3:
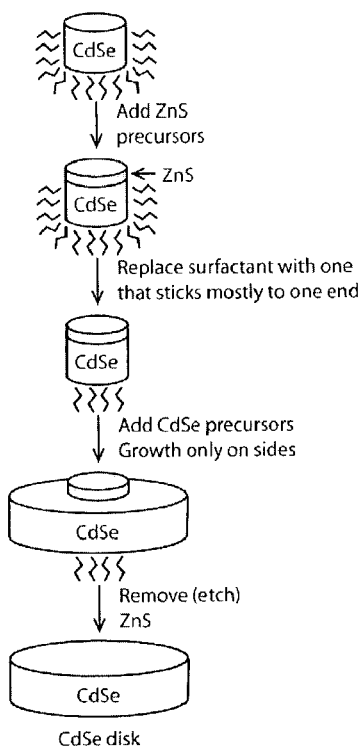
FIG. 3 schematically illustrates a growth method for controlled nanodisk formation.

The present invention is generally directed to the use of nanomaterials, and particularly nanocrystals, e.g., nanodots, nanorods and three dimensional or branched nanocrystals in optoelectronic applications that are expected to result in a new generation of electrooptic devices where each microscopic step (absorption, emission, transport, charge injection, etc.) is independently and simultaneously optimized, while retaining low-cost high-volume processing.

Similar to today's semiconductor optical amplifiers (SOAs), the "nanocomposite optical amplifiers" (NOAs) described herein embody a broad-functioned technology with applications throughout the telecom industry. Unlike SOAs, however, NOAs can be fabricated and processed like a plastic. As a result, it is expected that these electrically addressable NOAs will have broad applications in, e.g., low-cost lasers, detectors, amplifiers, wavelength converters, switches and variable attenuators that function over a broad spectral range in the near-infrared, and that can be easily integrated into complex active optical circuits using low cost methods such as inkjet or screen printing. These innovations should lead to an era of widely available highly integrated, low cost communications and networking. This platform technology of inexpensive, widely tunable, integrated optical circuits should enable pervasive, distributed networking, from robust, low-cost large area networks down to micro (personal, household) networks. This technology will provide ubiquitous, flexible and cost-effective broadband access, revolutionizing the telecom industry and ushering in universal connectivity.

The present invention addresses three fundamental technical challenges that have prevented semiconductor nanocrystals from providing the basis for inexpensive, highly-integrated optical circuits and high-efficiency photonics. In particular, the major technical barriers to the development of near-infrared (near-IR) NOAs include (1) Auger scattering—an intrinsic, extremely rapid non-radiative relaxation pathway that quenches laser emission in nanocrystals; (2) poor charge mobility in organic materials that prevents conduction of electricity at current densities high enough to sustain electrically pumped optical gain; and (3) specific semiconductor materials with an inherently symmetric crystal structure, preventing the use of available shape-control methods necessary for optimum performance.

Accordingly, it is at least one object of the invention to address some or all of these technical hurdles. For example, in at least one aspect, the invention is directed to methods of producing alloyed nanomaterials that will dramatically reduce the rate of Auger relaxation; eliminating the dominant non-radiative loss mechanisms that prevents the creation of optical gain (Goal: increase Auger scattering times to more than 5 ns—a 100× increase). This will require innovations in nanocrystal synthesis, shape control, shell-composition and fabrication. Success will provide vastly more robust nanocrystal materials that open a pathway for optically pumped nanocrystals lasers and amplifiers, increased efficiency LEDs and photovoltaics as well as "unsaturatable" fluorophores with applications as phosphors and even biological labels for confocal imaging, flow-cytometry and single molecule detection.

In another aspect of the invention is directed to materials and methodologies to enhance charge mobility and charge injection into nanocrystals in a supporting conductive optical-polymer matrix. In preferred aspects, such materials will have a charge injection efficiency of 1% at current densities of 1 kA/cm$^2$—a 1000× increase. This will require innovations in nanocrystal surface passivation and surface chemistry, aggregation control, conducting organic materials, electrical interface to nanocomposites and electrical interfacing between nanocrystals and the matrix material. Success will provide high-efficiency electrically addressable nanocomposite materials opening pathways for electrically pumped optical amplifiers and lasers, as well as variable attenuators, all-optical switches, wavelength converters, displays, LEDs, detectors, optical interconnects for microelectronics, high-efficiency, engineerable plastic electronics and even photovoltaics.

In a further aspect, the invention is directed to the production of shape-controlled III-V semiconductor nanocrystal composites in the near-IR range for robust lasing and amplification (Goal: replicate results for 1 and 2 in the wavelength range from 1200 nm to 1700). This will require innovations in shape-control in an inherently symmetric crystal material, alloyed shell-development, composite development, aggregation control, electrical interfacing and incorporation. Success in this area will provide completely engineerable III-V materials (in addition to the initial II-VI materials) opening a pathway to broad-band near-IR lasers, amplifiers, switches, wavelength converters and variable attenuators, as well as security inks, whole-body imaging, discrete signaling and taggants.

While addressing these technical hurdles, the invention is also directed to practical applications of the solutions to these problems, and particularly to the production of materials for electrically pumped NOAs in the range from 1200 nm to 1700 nm to enable the fabrication of low-cost and highly-integrated monolithic devices incorporating lasers, amplifiers, switches, variable attenuators and wavelength converters in optical communications. As an initial target application, we will focus on NOA-based broadband lasers and amplifiers that can be easily incorporated into highly integrated optical circuits capable of providing virtually limitless bandwidth directly to the home.

I. Reduction of Auger Scattering

Reduction of the rate of quenching "bi-excitons" by Auger scattering in nanocrystals by 100× is generally desired to reduce the threshold for electrically pumped NOAs and will enable development of continuous-wave (CW) lasers. Progress in reducing the rate of Auger decay will lead to major improvements in performance of virtually all optical and electronic applications of nanocrystals (LEDs, lasers, amplifiers, photovoltaics, plastic electronics, switches, phosphors, biolabels, etc.).

Stimulated emission from semiconductor nanocrystals comes from a bi-exciton state (i.e., a state with two electron-hole pairs). Unfortunately, relaxation by Auger scattering quenches this state on a timescale of 10–100 picoseconds, preventing stimulated emission. Although optically pumped nanocrystal lasers have recently been demonstrated (see, e.g., Klimov et al., Science, 290:314 (2000)), this achievement required ultra-fast (100 femtosecond) laser pulses to excite a population inversion fast enough to out-compete Auger depopulation. Obviously, this is impractical for commercial applications and suggests that we will not be able to create an electrically pumped laser without substantially changing the underlying dynamics of this process, to modify this intrinsic characteristic of nanocrystal physics.

Auger assisted recombination creates functional limitations on nanocrystals in other applications as well. Electrically active nanocrystal materials suffer from reduced efficiency due to Auger recombination; resulting from a misbalance of charge mobilities and injection rates in the material. For instance, a nanocomposite LED, where hole-mobilities currently dominate current flow, will often have an electron entering a nanocrystal that already has 2 or more holes present. The resulting electron-hole pair will not emit light, but rather Auger scatter releasing heat. This has had a substantial impact on any system in which charges are transported into or out of nanocomposite materials (e.g. lasers, amplifiers, LEDs, photovoltaics and plastic electronics). Auger scattering is also thought to cause fluorescence blinking and fluorescence saturation in nanocrystals that has limited their commercial use (see, Efros et al., Phys. Rev. Lett. 78:1110 (1997)) and will preclude the possibility of many future applications such as single-photon emitters for cryptography. Unfortunately, since this problem is of such high technical risk, and many applications can still be achieved in spite of Auger scattering (although with vastly lower efficiency), it is unlikely that anyone will pursue this problem without the help of federal funding. To remove Auger scattering as a barrier for further progress in practical laser applications, we will exploit innovations to.

Auger relaxation rates are a fundamental property based on fundamental parameters of nanocrystal physics. Fortunately, we can control these parameters through nanocrystal design. To decrease Auger rates, we will focus on innovations in three areas:

Theoretical predictions suggest that Auger rates depend strongly on the specific details of the electronic potential near the surface of the nanocrystals (see, e.g., Efros et al., Solid State Commun. 93:281 (1995). We will evaluate two independent methods of controlling the "abruptness" of the surface transition, involving creation of alloyed shells and multi-layered shells, forming a continuous transition in potential at the surface.

Surface-to-volume ratio and shape are also known to affect Auger rates. We will use innovative methods of controlled surfactant binding (see, e.g., Peng et al., Nature 404:59 (2000)) to create rod-like and disk-like nanocrystals.

Auger rates have been shown to depend on size, varying inversely with volume from ~10 to ~300 picoseconds for CdSe nanocrystals with diameters of 2 to 8 nm (see, e.g., Klimov et al., Science 287:1011 (2000)). This suggests that we should work with large sizes. We have selected a near-IR material (InAs) such that the largest nanocrystals are in the appropriate wavelength range. In addition, size-effects in InAs are stronger than in other materials, allowing us to use larger nanocrystal sizes without sacrificing the advantages of strong quantum confinement (e.g., color tunability, temperature insensitivity and lasing from bi-excitons). Based on theoretical models, epitaxially-grown nanocrystals that have an intrinsically gradual transition from core to surface do not appear to suffer from rapid Auger rates; indicating the potential of this approach.

To lower the effective lasing threshold, it is desirable to decrease the number of carriers required to create a population inversion; which is a substantial departure from the way people think about addressing this problem. Since nanocrystal lasing occurs from a bi-exciton state, population inversion requires each nanocrystal be excited twice. This requires a much higher excitation current density than is needed to produce a singly-excited state. Without being bound to a particular theory of operation, it is believed that laser emission from a singly-excited state can occur if the nanocrystal already has one or more permanent charge present inside its core. This would dramatically reduce the carrier density needed for lasing, allowing stimulated emission to effectively compete with Auger quenching. Such charged nanocrystals will be fabricated by either applying a gate-voltage to the device, or by incorporating a specific redox-active surface-ligand to the nanocrystals. This will only be explored as a fall-back position if we are unable to sufficiently reduce the rate of Auger relaxation through the innovations above.

The methods developed here derive from the overcoating procedures pioneered by Dabbousi et al., J. Phys. Chem. B, 101:9463 (1997), and Peng et al., Nature 404:59 (2000); modified to synthesize multiple shells and alloyed shells. The goal is to develop methods for the growth of one or more graded-alloy shells on the surface of CdSe nanocrystals (rods, spheres and disks), with precise control over the number and thickness of shells as well as alloy-gradient.

Figure 4:
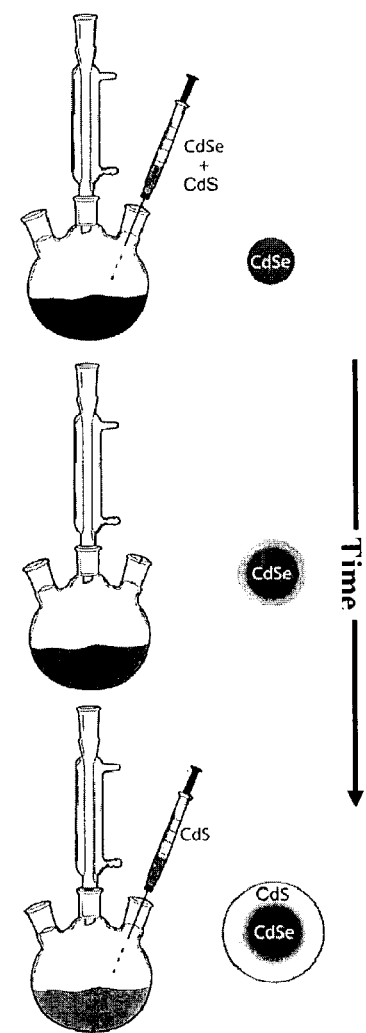
FIG. 4 schematically illustrates a one source alloyed shell synthesis.

We will fabricate a single graded-alloy CdS shell on a CdSe core with control over total shell thickness and gradient rate between CdSe and CdS Initially, we will synthesize this structure in a single step with a reagent-solution containing varying amounts of the precursors for CdSe and CdS (e.g., $Me_2Cd$, trioctylphosphine-selenium (TOP-Se) and $(TMS)_2S$) (see FIG. 4). Upon addition of this solution to a heated mixture (150 to 250 C.) of nanocrystal-cores in TOPO, CdSe will preferentially plate on the surface of the CdSe cores due to the inherent lattice-strain between CdSe and CdS. As the concentration of free CdSe precursors is reduced, equilibrium favors CdS addition to the surface; creating an alloy. The magnitude of the lattice mismatch and the relative concentrations of the reactants control the rate of transition from core to shell. At the end, only CdS precursors remain and the shell will grow to completion. If necessary, additional CdS precursor can be added at the end to provide independent control over alloy transition rate and total shell-thickness. Specific growth parameters will be determined empirically (see below), and include initial ratios and total concentration of reagents, addition and mixing rates, temperature, rate of temperature change during addition (if necessary to control alloying rate), and use of an additional CdS precursor addition.

Figure 5:
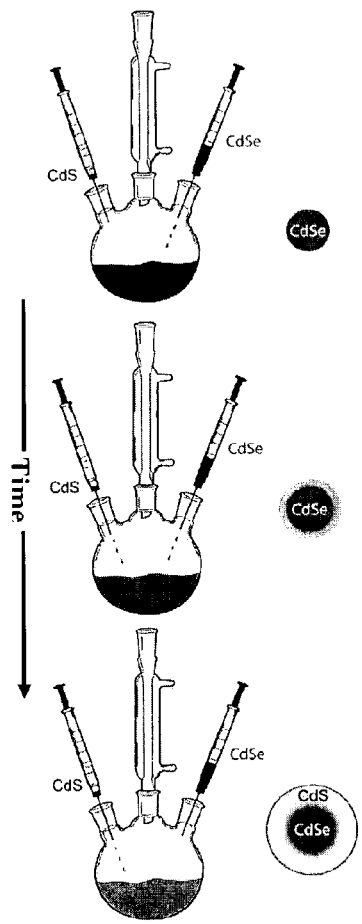
FIG. 5 schematically illustrates a two step alloyed shell synthesis.

It is possible that lattice-strain may dominate the alloy-gradient rate, preventing effective control of the transition from core to shell. Since this is expected to be a critical parameter in the control of Auger rate, it is important that we have the ability to control it as necessary. If the 1-step synthesis does not allow for this control, we will try a 2-step process in which both CdSe and CdS precursors are added independently (see FIG. 5). The CdSe source is added initially (drop-wise), followed by the CdS source, with addition of both reagents overlapping during the "alloying" stage. The relative rates of addition, relative and total volumes of reactants and the temporal overlap of additions will all be used to control gradient rate and total shell thickness.

Initially the 2-shell system will consist of a CdSe core followed by a graded-alloy CdSe/CdS shell and a final graded-alloy CdS/ZnS shell. The process will be guided by the results of the single shell growth above. The output from this task will be multi-shell nanocrystals with control over individual shell thicknesses and gradient rates.

Depending on the effect of lattice-strain, it may be necessary to select alternative shell-materials to produce optimum control. Potential substitutes include ZnSe for CdS in the first layer with ZnS as the outer layer. Use of ZnSe in the first layer presents a technical opportunity to substitute ZnO for the outer layer by controlled oxidation of the first shell. In this case, alloying between the ZnO layer and the ZnSe layer will be controlled by the concentration of oxygen and the reaction temperature. In addition, it should be possible to create the three-shell structure ZnSe/ZnS/ZnO by this method. Oxidation will be monitored by XPS.

Alternative means for reducing the rate of Auger relaxation may be accomplished by forming a multi-shell structure where each shell is very thin, and composed of materials with steadily increasing bandgaps. Sequential shells can be formed using our standard single-shell process, followed by precipitation from the growth solution and redispersal in a new shell-specific reaction solution. The process is repeated for each layer, yielding discrete shell-layers. By keeping the shells relatively thin (i.e., 1–2 monolayers), the exciton wave-function will still experience a change in potential that is more gradual than that of a single-shell structure; substantially reducing scattering rates. An example of one such multiple-shell structure is: CdSe core/ZnSe shell #1 (1–2 monolayers)/ZnS shell #2 (1–2 monolayers)/ZnO outer shell #3 (1–2 monolayers).

High-resolution transmission electron microscopy (HR-TEM) will be used to directly measure the average size and shape of bare cores and core-shell structures. HRTEM will also be used to measure the absolute thickness and uniformity of the resulting shells. Composition gradients within individual core-shell nanocrystals will be measured by the EDX, integrated into the HRTEM. The resulting dimensional and compositional profiles will be used as critical feedback to the synthetic process.

Average crystallinity and crystal structure will be measured on ensemble samples using XRD. Local crystallinity and crystal structure of individual cores and core-shells will be measured by electron diffraction in the HRTEM. Finally, a qualitative measure of shell "quality" will be made by measuring total fluorescence quantum yield as well as relative change in quantum yield upon addition of a known quenching (e.g. pyridine). These measures can detect shell defects that would otherwise be invisible by direct measurements (e.g. HRTEM, EDX or XRD).

The objective is to map the physical parameter phase space for Auger decay rates and determine an optimum set of materials characteristics for specified emission wavelength (e.g., size, shape, shell material, number of shells, shell thicknesses and alloy gradient-rates). The output will be a plot showing the general parameter trends that minimize the Auger decay rate for each emission wavelength.

Three novel methods will be developed to evaluate Auger rates. In order to map the effect of physical parameter changes on the Auger relaxation rates, a rapid characterization method will be used that provides an indirect measure of Auger rates. This method is called the Variable Stripe Measurement of Gain Coefficient (VSMGC). A high-power laser will be focused through a series of cylindrical lenses into a line with a length that can be changed using a slit. The line is focused on a thin film of nanocomposite and amplified stimulated emission (ASE) is measured from the side of the film as a function of stripe length. As length is increased beyond a distance where the travel time of photons from one end of the slit is longer than the Auger relaxation rate, ASE will saturate; providing an indirect measure of the Auger rate. This will be a simple, rapid method of screening changes in Auger rate for rapid feedback in the materials synthesis and phase-space mapping.

Alternatively, direct measurements of the relative intensity of 'on' and 'off' states in single nanocrystal fluorescence blinking as an alternative measure of Auger rate may be used. It is commonly believed that fluorescence blinking is the result of quenching by Auger relaxation of a transiently charged nanocrystal. As the Auger rate is reduced, fluorescence will begin to compete with Auger, and emission will be observed from the "quenched" state. By measuring changes in the on/off ratio, one can track the impact of physical changes on Auger relaxation. This is a very innovative application of a well-established phenomenon (see, e.g., Empedocles et al., Phys. Rev. Lett. 77:3873 (1996)).

Periodically throughout the phase-space mapping, specific samples are tested in a more complete functional test for relative Auger rates. Nanocrystals will be cast in an optically clear organic film to form an optical waveguide laser using standard lithographic techniques. A high intensity pulsed YAG laser will be coupled through a microscope lens into the waveguide to stimulate emission from the composite. ASE from the nanocrystal composite will be measured at the end of the waveguide. Alternatively, a sub-micron film without lithography can be pumped from a direction normal to the surface, and ASE measured from the edge the film.

Auger rates will be mapped using standard design-of-experiments techniques to probe the effect of nanocrystal diameter, aspect ratio, shell gradient rate, gradient thickness, overall shell-thickness and number of shells. The outcome of this task is a series of parameters, and preferably a set of quantitative trends, that define the preferred physical parameters as a function of emission wavelength to assist in materials development.

As an alternative strategy, we will study the effect of permanent charges inside nanocrystals on the threshold intensity for optically-pumped lasing. It is believed that the presence of a permanent charge delocalized in the nanocrystal core will allow lasing from a singly excited state. This should allow amplification and lasing to effectively compete with Auger decay.

It has been demonstrated that applying a strong voltage across a thin nanocomposite film will quench luminescence in nanocrystals by forcing charges into each of the nanocrystals. Using a sandwich-geometry between ITO and aluminum electrodes, we will study the threshold intensity for lasing as a function of gate-voltage and as a function of quenching ratio. Decreased threshold intensities will suggest that we pursue fabrication of intrinsically charged nanocrystals.

If back-gate measurements indicate that charged nanocrystals reduce threshold intensity for lasing, we will explore methods of nanocrystal surface modification to include redox-active chemical groups. The specific form of the redox agent will depend on the results of the back-gate measurements (i.e. do we need to add a positive or negative charge). Options include: 1) methylviologen—upon optical excitation of the nanocrystal, a hole will transfer to the methylviologen group, changing the oxidation from 2+ to 3+ and producing a "permanently" charged nanocrystal; 2) Thiocresol—similar to methylviologen, a small-amount of thiocresol incorporated into the surfactant (minimizing effects on solubility and charge-injection) causes nanocrystals to be charged upon initial illumination and remain so for many seconds (during this time, lasing by the medium continues to excite the nanocrystals, producing a perpetually charged state); 3) sodium biphenyl—acts like a radical ligand to inject a charge into the nanocrystal; and 4) combine nanocrystals with a metal, like sodium, by evaporation (as is done to charge $C_{60}$), or by dipping the film in a solution that contains the metal. These materials will be tested in the presence and absence of a gate-voltage as described above.

II. Current Injection

The present invention is also directed to the increased current injection into nanocrystals to electrically excite a population inversion. All electro-optical applications of nanocrystals (as well as all other areas of plastic electronics) currently suffer from low current flow. Advances in electrical coupling to visible and near IR nanocrystals will enable accelerated development of nanocomposite materials in a broad range of low-cost, high-volume electro-optic applications such as photovoltaics, LEDs, electrically pumped lasers and amplifiers, plastic electronics and much more.

A second major area is development of a system in which adequate current injection can be applied to the nanocrystals to excite a population inversion. All previous attempts to create high-efficiency electrically addressed nanocrystal devices have suffered from two major problems: 1) conduction of carriers through the matrix to the nanocrystal region of the device and 2) injection of carriers into nanocrystals.

The challenge of current injection is addressed along two parallel tracks, addressing charge conduction and charge-injection independently. First, vapor-deposited molecular organic matrix like those used for molecular organic-LEDs (OLEDs) is used as a prototype system for studying fundamental charge-injection into nanocrystals. The ultimate embodiment of the final material, however, will have the nanocrystals embedded in a conductive polymer matrix, compatible with high-volume, low-cost manufacturing by processes such as inkjet or screen printing. Although the molecular organic nanocomposites used as a model system can potentially form the basis of future products, achieving the vision of easily-processed integrated optical circuits requires success in both paths. Success will provide the design and manufacturing flexibility for active photonic devices to be incorporated into a wide array of applications beyond the initial telecom applications (e.g. displays, data storage and detectors).

Providing the greatest flexibility in incorporation of nanocrystals, requires a generic method of controlling the surface chemistry. This will be done by incorporating a generic linker-molecule onto the surface of the nanocrystals during the synthesis that can be easily modified using standard chemistries (as is commonly done for bioconjugation). These methods will provide limitless flexibility in the ways that nanocrystals are handled, incorporated and used.

Molecular electronics are better understood than polymer electronics and offer higher intrinsic carrier mobility. Molecular devices are also generally evaporated, allowing for the production of complex layered structures that would be difficult to fabricate with polymers. The ultimate drawback of such a molecular system is the expected high costs of manufacture (relative to polymer composites). By studying fundamental nanocrystal materials in a molecular electronic system, however, we can separate the issues involved in creating an efficient nanocrystal device from those of creating a high-quality polymer device. In addition, molecular organic nanocomposites may represent an early opportunity to bring this technology to market with many of the technological benefits of the final polymer system (but without all of the cost and processing benefits.

Ultimately, the electrical characteristics designed in the molecular system will be incorporated into a polymer based composite that has appropriate conductive and optical properties. Developing the polymer-based system will involve: creating an optically transparent composite with precise aggregation control of the nanocrystals. Phase segregation of nanocrystal and polymer phases must also be controlled. This would be accomplished through the use of compatible surface functionalization binding ligands (e.g., surfactants), polymer functionalization and mixed co-solvents for preparation and deposition of the composite films; and reducing the recombination of carriers in the polymer phase and trapping of carriers at the polymer/nanocrystal interface. This will be achieved through a choice of matrix polymer and nanocrystal surface ligands to promote charge transfer into the nanocrystal. The optimum solution will have the surface ligand perform dual-functions to control aggregation and enhance charge-transfer.

Nanorods will provide higher charge mobilities and injection efficiencies because electrons can conduct inside the nanorods rather than through the polymer matrix (like nanoscopic wires). To achieve this, nanorods will have to be aligned within the polymer matrix; perpendicular to the electrodes. This will be achieved through a combination of liquid crystal phases, electric fields and the use of an organic linking molecule, one end of which binds selectively to only the end of the nanorods, the other to the electrode surface. An alternative, higher risk approach uses "self-aligning" tetrapod-shaped nanocrystals attached to the electrode substrate. Tetrapods always sit with one arm pointing up. A secondary benefit of aligned nanorods is intrinsic polarized output, with the potential to enhance gain in appropriately designed systems.

In accordance with this aspect of the invention, are provided materials and architecture for a nanocomposite LED with high conversion efficiency (greater than 1%) and current densities high enough to excite a population inversion (greater than 1 $kA/cm^2$). The two alternate approaches used to achieve this are: 1) the use of controlled molecular organic conducting structures as a model system; and 2) multi-layer conducting polymer structures as a low-cost production material. The molecular organic system will be used to study the effects of surface ligands on charge injection and act as a model system for designing and optimizing complex multi-layer devices. These structures and chemistries will then be transferred into the multi-layer polymer system. To facilitate rapid development, a generic surface chemistry will be used that allows modification of the nanocrystal surface for flexible incorporation and aggregation-control of nanocrystals in molecular and polymeric matrices. Shape control and alignment of nanocrystals will also be evaluated for their contribution to charge transport. The availability of these structures opens a clear technical pathway to virtually all electrical and electro-optical applications of nanocrystals such as high-efficiency, low-cost and flexible solar cells; multi-color LEDs and true-color displays; high-performance plastic electronics; and many low-cost highly integrated optical components such as lasers, amplifiers, all-optical switches, modulators, variable attenuators and the like.

Figure 6:
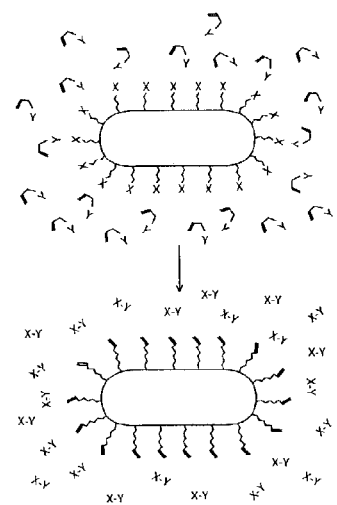
FIG. 6 schematically illustrates a generic nanocrystal surface chemistry.

FIG. 6 schematically illustrates a generic surface chemistry approach to facilitate rapid control of incorporation, aggregation and current injection of any nanocrystals in both molecular and polymer matrices. This will be achieved through a standard derivitization of the surface-bound ligands used as surfactants. The distal end of the ligands will be chemically modified to have a functional group (X) that can be readily reacted with a complementary group (Y) contained at one end of a second family short organics used to enhance solubility in the selected matrix. If we use an alcohol for X and a halide for Y, for example, by adding a slight amount of base an SN2 reaction takes place resulting in the formation of an ether. The reaction that links the two groups must take place under very mild conditions so as to not detrimentally affect the properties or solubility of the nanocrystals and should have high yields. Other chemistries compatible with this strategy can be borrowed from the wealth of information in the biological community for bioconjugation, including peptide bond formation and maleimide coupling. The results of this process will be tested by determining the surface chemical-groups using techniques such as Fourier transform infrared spectroscopy (FTIR), x-ray photoelectron spectroscopy (XPS), and/or solid-state nuclear magnetic resonance (NMR). The solubility of the nanocrystals in a solution of monomer or molecular conductor will also indicate success.

An alternate approach relies on surfactant exchanges after growth to coat the nanocrystals with the newly designed ligand that has both the polymer/molecular mixing group at one end and a nanocrystal binding group at the other. This will be done by refluxing the nanocrystals taken from the growth solution in the new ligand. If repeated several times we expect this to yield a high percent of surfactant exchange (i.e., appropriate for prototype development).

Molecular organic electronic structures are generally created using a combination of evaporative and spin-coating processes. The evaporation of small molecules and condensation onto a substrate allows for finely controlled deposition and the design of complex layered structures that can be engineered to balance carrier conduction and optimize charge injection into one of the layers. Because of these advantages, molecular organic systems offer a model platform for optimizing nanocrystal/organic devices. We will evaluate two strategies for the incorporation of nanocrystals into such layered structures.

For inorganic nanocrystals that are chemically compatible with the molecular organic layer through the use of appropriate ligand species (Task 2.1), the nanocrystals can be dispersed in the molecular organic and spin coated to produce a uniform thin film. If, however, the surface coating on the nanocrystals is not sufficiently compatible with the matrix polymer, a layered structure may result with the molecular-organic layer laying down first and a thin (a few monolayers) film of nanocrystals on top. This scenario can be exploited to create well-defined layered structures that can be engineered to bring carriers directly into the thin layer of nanocrystals.

Methods will also be employed whereby nanocrystals are sequentially "sprayed" in vacuo, using misting or electrospray methods, into thin molecular films as they are deposited to create engineered layer structures. This method has the potential to create layers of nanocrystals homogeneously mixed into a molecular organic thin film, as well as alternating layers of nanocrystals and organic thin films. Although of very high risk, this technique will provide a substantially more flexible method of depositing nanocrystals because it does not rely on finding application-specific solvent systems, e.g., solvents compatible with both the nanocrystals and organic molecules being used.

Two strategies will be used to create model structures for high-efficiency LEDs. The primary thrust will be a nanocomposite LED modeled after traditional OLEDs, with direct electrical injection into an active fluorescence nanocrystal layer. The alternative strategy will rely on energy transfer from a molecular organic fluorophore to the nanocrystal rather than direct charge-injection. The energy transfer strategy eliminates the need for developing surface chemistries that promote charge-injection. This will greatly simplify and expand the flexibility of selecting materials and surface chemistries to enhance nanocomposite mechanical and optical properties.

The first model structure will consist of four layers sandwiched between 1 mm diameter ITO (indium doped tin oxide) anode and Mg/Ag cathode. The bottom layer will consist of a hole-transport molecule, e.g., TPD (N,N'-diphenyl-N,N'-bis(3-methylphenyl)-(1,1'-biphenyl)-4,4'-diamine); the second layer will be a thin film of pure nanocrystals, i.e., the active luminescent layer; the third layer will be a hole-blocking layer, e.g., TAZ (3-(4-Biphenylyl)-4-phenyl-5-tert-butylphenyl-1,2,4-triazole); the final layer will be an electron conducting layer, e.g., $Alq_3$ (tris-(8-hydroxyquinoline) aluminum). These lead candidate materials were selected because they are typical materials used in experimental molecular organic LEDs and can be deposited using controlled techniques.

The nanocrystals will be mixed into a chloroform solution of TPD, and spin-cast onto clean, ITO-coated glass. 20 nm to 100 nm thick layers of nanocomposite will be evaluated at varying densities. By optimizing the nanocrystal surface-functionalization and concentration, this mixture may be forced to segregate to form a bilayer film with the nanocrystals on top. Next, a 10 nm layer of TAZ will be evaporated, followed by a 40 nm evaporated film of $Alq_3$. This structure will then be capped by evaporating a cathode structure composed of 75 nm of Mg:Ag (10:1 by mass) and 50 nm of Ag. The spin-casting and device manipulation after growth will be performed in a dry nitrogen environment.

Specific parameters of materials, concentration and layer thickness will be optimized empirically. Atomic force microscopy (AFM) will be used to characterize the phase-segregated films and absorption measurements will be used to characterize the density and thickness of the nanocrystal layers. The resulting structures will be characterized quantitatively by measuring electroluminescence output of the LED as a function of current efficiency (i.e., number of photons out divided by number of charges in), as well as the current density through the device as a function of voltage.

CdSe nanocrystals are typically arranged into thin films by spin-casting from solution. While spin-casting is possible for molecular organics, this deposition method constrains the choice for nanocrystal host material to those molecular organics that are highly soluble in the preferred solvents for the TOPO capped nanocrystal colloids, e.g., toluene, alkanes and chloroform. In order to have flexibility in designing layer composition and thickness we will require a solubility of at least 10 mg/mL. Finally, in order to create the phase-segregated nanocrystal monolayer within the active region of this proposed structure, the organic host material must phase segregate appropriately from the nanocrystals during the spin coat process. We believe that TPD in chloroform will meet all of these criteria (as a blue emitting material, TPD is also a candidate for the energy donor in the energy transfer excitation strategy below).

The second model structure will have the active layer composed of nanocrystals homogeneously dispersed in the hole-transport material. Devices with nanocrystal volume fractions of 1% to 10% will be evaluated. In this model the hole transport molecular organic must also be a fluorescence energy transfer donor to the imbedded nanocrystals. For nanocrystals, which absorb over a very broad spectrum, this can be any fluorophores with emission bluer than the bluest nanocrystals to be excited. In this scheme, carrier recombination takes place in the hole transport layer not inside the nanocrystals. This is followed by rapid energy transfer into the nanocrystals and subsequent light emission from the nanocrystals.

The primary strategy for nanorod alignment is to develop organic surfactants that bind strongly to only one end of the nanorods, and functionalize the other end of these surfactants to have affinity for the surface of the cathode. In the case of CdSe, alkyl phosphonic acids bind more strongly to the 00-1 face of nanorods than any other face. For InAs we will use the binding group(s) developed in Task 3.3 for selective end-binding. For testing or device development we will coat the sides of the nanocrystal with the solubility-enhancing polymer (task 2.2), add the selective linker to bind to one end, and then coat the solution of nanorods in monomer onto the substrate.

Figure 7:
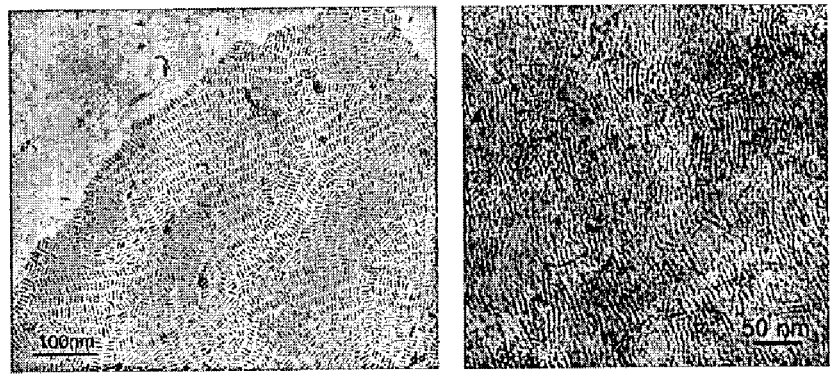
FIG. 7 shows the smectic liquid crystal phases of nanorods.

CdSe nanorods have been observed to exhibit liquid crystalline phases under certain conditions (FIG. 7)(see also Li, et al., Nanoletterss 2002 (in press)). We will evaluate a range of monodisperse nanorods to identify conditions under which they behave like liquid crystals. If successful, we will be able to align the resulting nanorods by applying a small electric field as is commonly done with organic liquid crystals. Progress will be assessed by cross-sectional TEM and SEM measurements of the embedded nanocomposites. Phase separation can be monitored by studying surface roughness by AFM. Even partial alignment will be judged a success since once we have partial alignment, we can refine the process to better balance alignment versus mixing concentrations.

If the concentration required to produce liquid crystal phases is sufficiently high to cause phase separation of nanorods from the polymer, we will examine binary mixtures of nanorods and an appropriate semiconducting polymer that also exhibits a liquid crystal phase. We will explore polymers with roughly the same length as the candidate nanorods, functionalize them as described in task 2.1 (for compatibility with the matrix material) and mix them with the nanorods. We expect to find a range of lengths and diameters over which the polymer/nanorod mixture will exhibit a joint liquid crystalline phase.

In alternate aspects, a variety of different nanorod shaopes may be employed, including simple nanorods, as well as 4 armed branched nanorod structures, als termed "tetrapods" herein. The same custom polymers used for enhanced solubility and end-selective binding of nanorods can be used with tetrapods. When deposited on a surface, these shapes will bind to the cathode via 3 arms, with the fourth perpendicular to the electrode. Electron injection should be enhanced due to multiple pathways for electron injection. Emission in these structures may also be linearly polarized if it takes place preferentially in the one perpendicular arm (currently unknown).

III. Shape Control of Nanomaterials

Also of import is the design and synthesis of shape-controlled III-V semiconductor nanocrystals with emission in the near-IR wavelength range between 1200 nm and 1700 nm. Unlike II-VI materials, III-V nanocrystals are produced using highly reactive organometallic precursors, a higher temperature regime, and are characterized by new kinetic models and design considerations. Normally symmetric crystal structures also prevent the use of traditional shape-control methods from II-VI materials. High-quality shape-controlled III-V nanocrystals in this spectral range will impact telecommunications, discrete signaling, military tagging, spectral encoding, infrared detecting, biological tagging and whole-body imaging.

For NOAs to have practical applications in the telecom industry, materials must be developed that emit from 1200 nm to 1700 nm. There are several III-V semiconductor materials such as GaAs that emit in this range that are already used to produce traditional (non-nano) lasers and amplifiers. Advances in III-V nanocrystal synthesis will enable new applications ranging from inventory control, security inks and taggants, to near-IR detectors, biological detection systems, blood screening and whole-body imaging.

The preferred nanocrystal material for this aspect of the invention is InAs due to the appropriate wavelength range and relative environmental compatibility compared to other appropriate materials such as HgTe. The long-wavelength emission limit of InAs is defined by the bulk band gap (~3400 nm). As crystal size is decreased, the wavelength can be tuned all the way to ~800 nm. Synthetic methods have already been developed by our scientists for small InAs nanocrystals (below 1400 nm[6]). Unfortunately, while this gives us a starting point, no one has made InAs nanocrystals in the spectral range needed for these applications. Currently, no methods for shape-control have been developed; which would be needed to reduce Auger rates.

To date, InAs nanocrystals have not been grown large enough to emit beyond ~1400 nm. The invention, however, will employ a robust chemistry capable of forming monodisperse distributions of InAs nanocrystals (±5% in size) emitting out to 1700 nm. This approach will modify existing precursors to control the rate of decomposition in the growth kinetics of II-VI and III-V nanocrystals. The proper design of precursors, and the use of higher nucleation temperatures are expected to result in better synthetic control and larger nanocrystal sizes. Candidate precursors include $InCl_3$ and $TMS_2As$ "backbones" modified with organic ligands of different lengths and functionalities to control and optimize growth properties. Alternative approaches include: 1) forming InAs cores with emission in the 1300 nm to 1500 nm range (a less challenging task) followed by coating with an shell of InP that pushes the emission out to 1700 nm; and 2) size selection instead of size-focusing to reach the required narrow size distribution, also pushing the spectral range farther to the red.

Another inherent problem is that emission from InAs nanocrystals is inherently low, primarily due to lattice-mismatch between core- and shell-materials. In addition, innovative shell-structures will be developed in accordance with the methods described above, will be transferred to III-V nanocrystals. To generate high-quality shells, the technical challenge is epitaxial growth of materials with increasing bandgaps onto the core III-V nanocrystal that simultaneously provide the confinement required by Auger reduction and strain-reduction required by lattice-mismatch. This will require major innovation in synthesis, balancing the tradeoff between reactivity of precursors and reaction temperature to prevent nucleation of new nanocrystals while producing annealed epitaxial shells. Initially, a novel strategy will be employed to grow multi-layer shells in a single step (as described above) to optimize strain and gradient control.

To date, there is no liquid-phase method for shape-control in III-V nanocrystals because they are typically grown with a low-symmetry cubic crystal structure. Shape-control in nanocrystals relies on the difference in surface energy between different crystal faces of an anisotropic crystal to promote or inhibit growth in one or more direction. For cubic InAs, no such anisotropy exists.

To solve this challenge, the invention will employ novel precursors that decompose at a temperature high, enough to favor nucleation of a non-symmetric crystal structure such as wurtzite. This will enable the growth of nanorods of selected length and diameter instead of spherical nanocrystals. An alternative approach is to take advantage of the cubic symmetry, and use surfactants to promote growth of rods off this central region to make 4-armed tetrapods. This represents another very innovative solution to a currently unsolved (and considered possibly unsolvable) problem.

Another aspect involves the development of a robust synthetic process capable of making soluble, size- and shape-controlled InAs/CdSe/ZnSe/ZnS core/shell nanocrystals with emission maxima covering the range of wavelengths from 1200 nm to 1700 nm and quantum yields exceeding 50%. We expect the resulting nanocrystals will have core diameters ranging from 5–10 nm, a size distribution of less than 10%, and shell thickness variability of less than one monolayer. We expect the resulting nanorod cores to exhibit length and diameter size distributions of less than 10%. When coated with appropriate shells these nanorods will have quantum yields exceeding 25%, and have utility in areas ranging from security inks to biological labels to near-IR signaling devices and near-IR detectors.

An important step for improved synthetic capability is to develop a strategy for selecting organometallic precursors to grow the desired III-V semiconductors that decompose rapidly at low temperatures (i.e., around 200 C.). The choice of precursors is a balance between decomposition rates as a function of temperature. Precursors must decompose rapidly enough so all nanocrystals nucleate at the same time, yielding a narrow size distribution, but not so rapidly that growth takes place in an uncontrolled manner. They must also be flexible enough to work over a wide range of temperatures (for example 200–500 C.) to facilitate controlled nucleation and growth of specific crystal structures for shape-control. The initial precursors will include $InCl_3$ and $TMS_2As$. In addition, it is known that the temperature stability of these reactive materials depends strongly on their complexed ligands. We will systematically study the effects of complexing metals with alkyl chains of different lengths and incorporating different functional groups to provide a means to change the decomposition temperatures and rates of reaction. In addition to supplying the needed materials for this proposal, this work will provide further insight into the growth mechanisms and kinetics of nanocrystal formation.

Surfactants are selected that are able to withstand temperatures higher than the current surfactant-limited temperature of ~300 C. This will enable access to a temperature range higher than currently available with use of existing surfactants and provide some flexibility in case we are unable to find suitable lower temperature precursors. It is our expectation that higher process temperatures will yield faster decomposition of precursors, faster growth, and improved monodispersity and crystallinity of the resulting nanocrystals. High-temperature surfactants will also enable us to grow nanocrystals in high temperature phases if necessary for shape-control in Task 3.3. There is a balance in choosing a surfactant because it plays two roles. During growth at an elevated temperature, the surfactant must be labile enough to allow access to the surface of the growing crystal to monomers, while at the same time it is not so labile as to not cover a large portion of the nanocrystal, thereby allowing aggregation of particles. At lower temperature it must be bound strongly to the surface to solubilize the nanocrystals. Therefore, ideal surfactants are those that have organic alkyl chains on one end that provide solubility in organic solvents, and a functional group on the other end that binds strongly to the nanocrystal surface. Examples of such surfactants include: tri-n-octylphosphine (TOP), TOPO, and alkyl amines. To test surfactant stability, NMR or FTIR can be used to monitor the surfactant after heating to the desired temperature.

The choice and development of precursors and surfactants is generally done simultaneously, as the temperature and surfactant will determine the decomposition rate and mechanism of the precursors. The only true test of these two variables is the crystallinity, end size, and size distribution of the resulting nanocrystals. We will determine crystallinity by XRD, and electron diffraction in a HRTEM. Sizes and size distributions will be determined by HRTEM and correlated to observed optical properties (e.g., absorption and luminescence) to provide a mechanism for in situ monitoring of nanocrystal growth. We believe that we will need to grow spherical InAs nanocrystals with diameters ranging from ~5–10 nm to cover the desired wavelength range of 1400–1700 mm.

The output of this task will include: 1) a combination of precursors and surfactants that allow the reproducible production of desired InAs nanocrystal sizes with a narrow size distribution. In typical systems, reproducibility is important: rapid decomposition of the precursor should not come at the expense of uncontrollable, and hence non-reproducible, growth; and 2) a guide for nanocrystal growth optimization to yield particles with acceptable size and size distribution. It is important to be able to identify focusing and defocusing growth phases. At high concentration of monomers (after the nucleation step) the system is in the focusing regime in which the smaller nanocrystals grow faster than the larger ones-leading to a narrowing of the size distribution. At lower concentration of monomers (at a later stage of the growth as monomer is depleted), smaller particles grow slower than larger particles.

An alternative approach is to take InAs cores with emission in the 1300 nm to 1500 nm range and coat them with a shell of InP or CdSe to red shift their emissions out into the 1400 nm to 1700 nm region (see Task 3.2). In addition to providing the specific materials for this application this process will provide us with new tools for the precise control of emission wavelengths in nanocrystal materials.

It is possible that any commercially viable process (i.e., set of temperatures, reaction rates and yields) will result in a size dispersion too large for critical telecommunications applications. In this case, one can use size-selective precipitation to augment size-focusing to produce the required size distributions (but at a decrease in production yield).

As with the model system, the first shell material should have a low lattice-mismatch to InAs with a larger band gap. An ideal material is CdSe, which will red-shift the emission of the InAs nanocrystals because the potential barrier is not that large and the carrier wavefunctions can extend into the shell material, reducing confinement in the core. The use of CdSe is ideal, since the processes can then be applied directly to these materials (since after a CdSe shell, the nanocrystals look like a CdSe nanocrystal). Alternative materials also include InP. Methods for growing these materials on InAs exist for small nanocrystals. Problems exist when trying to grow these materials on larger or non-spherical nanocrystals due to the tendency of many II-VI materials, such as CdSe and ZnS, to favor the hexagonal wurtzite structure instead of the InAs cubic zinc blende structure. No attempts have been made to incorporate these different materials into graded shell structures. We believe that CdSe, which can be grown as zinc blende under appropriate conditions, will be forced into this crystal structure during the alloying process, facilitating further shell-growth. A good second layer shell material would be ZnSe which has a larger band gap, but is very reactive under atmospheric conditions. ZnSe would require a third, capping layer of the more stable, larger band gap ZnS to prevent oxidation.

The advantage of the 1-step approach to multi-shell synthesis (see Task 1) is that the precursors for the components listed above, (e.g., Cd, Se, Zn and S) mixed together with a solution of InAs nanocrystals should spontaneously order to form the desired sequence listed above. This is due to the lattice mismatch between the crystal structures. The mismatch between InAs and CdSe is <1% so CdSe should grow on the core first. The mismatch with ZnSe is ~6% so that should grow second. Finally, the mismatch with ZnS is ~11% so that should form the final layer of the shell. The shell thickness is controlled by injecting different amounts of shell precursors. Alternatively, a sequential addition can be used.

After growth of graded core/shell nanocrystals, they will be photoannealed under low power (~100 mW) laser illumination. Photoannealing is believed to increase shell-quality (observed as an increase in QY) by removing surface and/or interfacial defects that may be present at the core/shell interface. This will be done using the 488 nm line of an Ar ion laser; sufficient to deposit a large amount of energy into the low-bandgap InAs, but at a concentration where no significant heating takes place.

In order to facilitate high-efficiency electrical injection, it is generally desired to produce these core-shell material on nanorods, as described above, but transitioning from spheres to rods is in the shape of the underlying core. Since nanorods have extended surfaces in one dimension, strain becomes much more pronounced than in high curvature spheres; and it is more difficult to grow thick shells of highly strained materials on extended surfaces. Experience suggests that instead of growing as desired they tend to form small islands on the surface of the nanorod to relieve strain. By using a graded-alloy approac, it is expected that this strain will be relieved, allowing growth of thick shells since the lattice parameters are also graded. The initial layers more closely match the lattice of the core (hence less strain) and the strain continues to decrease with each additional shell material.

It is also desirable to provide synthetic strategies for controlling the shapes of III-V nanocrystals. In order to accomplish this task the knowledge gained from shape control of CdSe nanocrystals, described above, will be transferred to InAs. The approach described above for CdSe cannot be directly transferred to InAs, however, for several reasons: a) the more covalent character of most III-V semiconductors makes them much more stable in the cubic phase and the intrinsic high symmetry of this phase makes it unlikely to grow anisotropic particles such as rods; b) even if a wurtzite structure can be grown, it is unlikely that the same combination of surfactants (phosphine oxides and phosphonic acids) will function for III-V nanocrystals, since III-V and II-VI materials have different metal-ligand chemistries. We will use a combination of surfactants, precursors and temperatures that will favor the growth of wurtzite InAs nanocrystals, which will provide a starting point for subsequent shape-control. Given the high risk of this approach, we will try several different approaches.

Our first approach will be to synthesize surfactants that allow grow of the base InAs nanocrystals at temperatures above 360° C. because higher temperatures should favor the growth of wurtzite InAs (by reference to experience with CdSe). Crystal structure will be determined by XRD and TEM; success, the growth of wurtzite InAs.

Where it is feasible to be able to nucleate an asymmetric InAs nanocrystal, organic surfactants will be used that bind more strongly to the sides than the ends, allowing for the growth of nanorods. Because InAs synthesis will likely be performed at higher temperatures, it is expected that different surfactants from those used for CdSe will be used. Progress will be assessed by TEM measurements of the shape of the nanocrystals evaluating any anisotropic growth.

Figure 8:
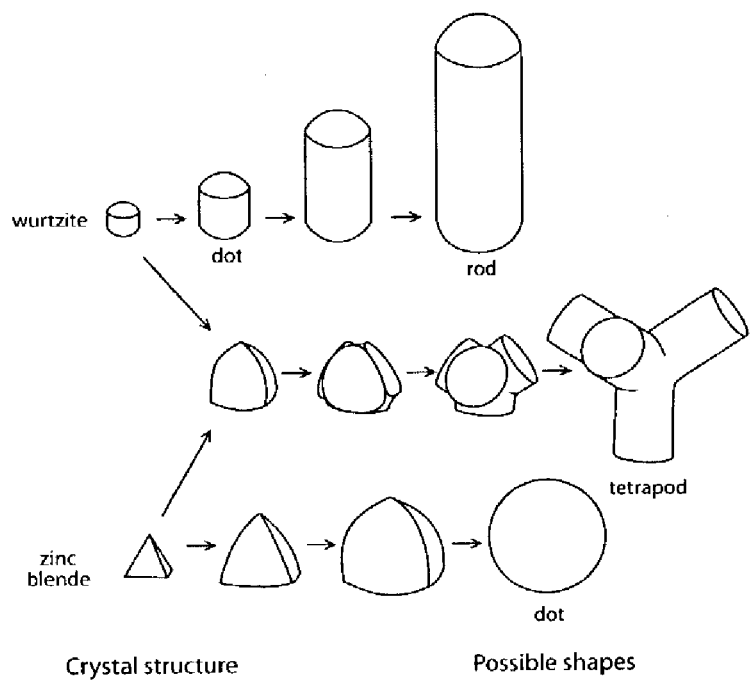
FIG. 8 schematically illustrates shape controlled growth of nanomaterials.

An alternate method to nucleating with wurtzite InAs nanocrystals, takes advantage of the stability of InAs at 300 C. in the cubic structure, performing the initial injection at the lower temperature to create pyramidal nuclei and then rapidly raising the temperature to promote wurtzite growth to make 4-armed tetrapods (see FIG. 8). Progress will be assessed by TEM and success will be the growth of tetrapods of InAs.

In particularly preferred aspects, the above described methods, materials and parameters will result in InAs nanocomposites with emission between 1200 nm and 1700 nm incorporated into an optically pumped nanocrystal laser with the performance parameters of Task 1 (i.e. CW pumping and Auger decay longer than 5 ns), and high-efficiency near-IR LEDs with the performance parameters of Task 2 (greater than 1% injection efficiency at 1 kA/cm$^2$ current density).

While the predominant applications described herein relate to broad-band amplifiers, the NOA technology described herein can directly expand to function as lasers, detectors, wavelength converters, switches and variable attenuators. Further, due to the small scale of these devices, and there facile integration, it is expected that such devices and systems would be readily integrated into a single chip. This broad platform technology will create a paradigm shift in the development of telecomm network components, and the flexibility with which new network architectures are developed, enabling the development of optical broadband communications all the way to the home.

What is claimed is:

1. An optical device, comprising:
   an optical amplifier that comprises a nanocomposite material that includes:
   InAs or CdSe nanorod cores having one or more core-overcoating shell layers made of a semiconductor material selected from the group comprising ZnS, InP, CdSe, CdS, and ZnSe disposed thereon, wherein the core-shell nanorods emit light at from about 1200 nm to about 1700 nm; and have Auger scattering times greater than 5 ns.

2. The optical device of claim 1,
   wherein the nanorods are disposed in a conducting polymer matrix.

3. The optical device of claim 1, wherein the nanorods comprise InAs cores having a shell layer of ZnS disposed thereon.

4. The optical device of claim 1, wherein the nanorods comprise InAs cores having a shell layer of InP disposed thereon.

5. The optical device of claim 1, wherein the nanorods comprise InAs cores having a shell layer of CdSe disposed thereon.

6. The optical device of claim 1, wherein the nanorods comprise InAs cores having a shell layer of ZnSe disposed thereon.

7. The optical device of claim 1, wherein the nanorods comprise CdSe cores having a shell layer of CdS disposed thereon.

* * * * *